United States Patent [19]

Hino et al.

[11] Patent Number: 4,703,302
[45] Date of Patent: Oct. 27, 1987

[54] RESISTANCE LADDER NETWORK

[75] Inventors: Youzi Hino; Hironobu Ogawa, both of Kawasaki, Japan

[73] Assignee: Fujitsu Limited, Kanagawa, Japan

[21] Appl. No.: 652,686

[22] Filed: Sep. 20, 1984

[30] Foreign Application Priority Data

Sep. 20, 1983 [JP] Japan .................. 58-173735

[51] Int. Cl.[4] .............................. H01C 3/12
[52] U.S. Cl. .................. 338/293; 338/260; 338/254; 338/307; 338/314; 340/347 DA
[58] Field of Search ........... 338/292, 254, 260, 320, 338/334, 306-314, 293, 284, 287, 288, 289, 280; 340/347 DA, 347 M

[56] References Cited

U.S. PATENT DOCUMENTS

| 2,629,166 | 2/1953 | Marsten et al. | 338/292 X |
| 2,878,357 | 3/1959 | Thomson et al. | 338/292 |
| 2,994,862 | 8/1961 | Preston | 340/347 M |
| 3,965,330 | 6/1976 | Williams | 338/307 X |
| 4,336,528 | 6/1982 | Kane | 340/347 DA |

Primary Examiner—E. A. Goldberg
Assistant Examiner—M. M. Lateef
Attorney, Agent, or Firm—Armstrong, Nikaido, Marmelstein & Kubovcik

[57] ABSTRACT

A plurality of resistors connected in a ladder format and disposed in parallel with each other. Each of the resistors has a resistance part and two mutual connection ends connected to the resistance part. The mutual connection ends are gathered at one side with respect to the resistance part.

9 Claims, 11 Drawing Figures

RESISTANCE LADDER NETWORK

BACKGROUND OF THE INVENTION

1. Field of the Invention

The present invention relates to a resistance ladder network, more particularly to an R-2R type or $2^n$-R type resistance ladder network.

2. Description of the Prior Art

Resistance ladder networks are commonly used for digital-to-analog (D/A) converters. The resistors of a resistance ladder network are normally diffusion resistors and thin film resistors. The diffusion resistors are formed in a short strip form and so that all are fairly parallel. In the layout of the resistors, there must be a portion of wiring parallel to a diffusion layer forming the resistors, in other words a portion running from one end to the other of the diffusion layer. Therefore, it is not possible to form another wiring layer horizontally traversing the diffusion layer. If an insulation layer is inserted between the wiring, it is possible to form another wiring, but this has to be an unpreferable aluminum two-layer wiring and increases the number of masks in the manufacturing process. Thus, the yield rate decreases and the manufacturing process becomes more complex.

SUMMARY OF THE INVENTION

It is, therefore, an object of the present invention to provide a resistance ladder network which can form another wiring layer horizontally traversing the diffusion layer without forming two conductive layers.

According to the present invention, the above object is achieved by a resistance ladder network which comprises a plurality of resistors connected in a ladder format and disposed in parallel with each other, each of the resistors having a resistance part and two mutual connection ends connected to the resistance part, which ends are gathered at one side with respect to the resistance part.

According to the present invention, it is possible to use the upper resistance array layer of an R-2R type resistance ladder network and a $2^n$-R resistance ladder network for passage of other wiring on the same level as the wiring for connection of the resistors. Therefore, it is useful for improving the degree of integration of large-scale integrated circuits (LSI's).

BRIEF DESCRIPTION OF THE DRAWINGS

The present invention will become clearer from the ensuing description of preferred embodiments made in reference to the accompanying drawings, in which.

DESCRIPTION OF THE PREFERRED EMBODIMENTS

Before describing the preferred embodiments the present invention, a detailed description will be given of the prior art for reference proposes.

Figure 1:
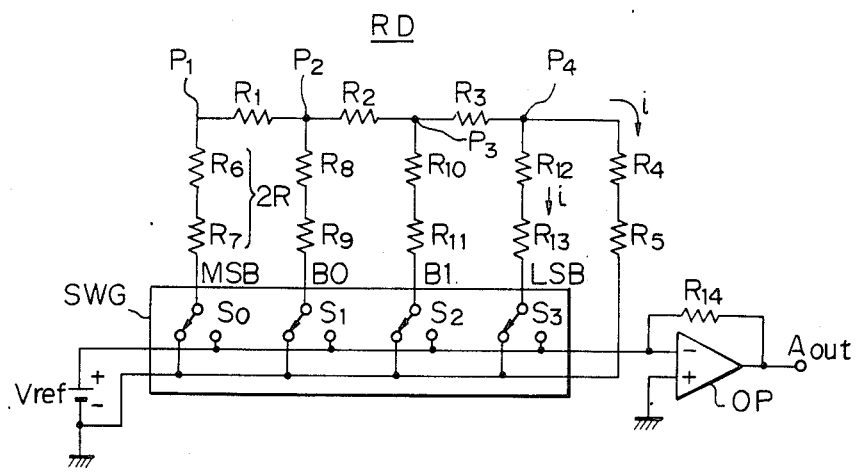
FIG. 1 is a circuit diagram of an R-2R type D/A converter according to the prior art.

An R-2R type D/A converter which uses an R-2R type resistance ladder network is, as shown in the example schematically illustrated in FIG. 1, comprised of an R-2R type resistance ladder network RD, switch group SWG, and operational amplifier OP for converting the output current to voltage. This example is a current-driven type. There is also a voltage-driven type.

The resistance ladder network RD includes five resistors $R_1$ to $R_5$ connected in series. One of the ends of the five resistors $R_1$ to $R_5$ are grounded; the other of the ends $P_1$ are connected to a switch $S_0$ via two resistors $R_6$ and $R_7$. A junction point $P_2$ is connected to a switch $S_1$, via two resistors $R_8$ and $R_9$, $P_3$ to a switch $S_2$ via two resistors $R_{10}$ and $R_{11}$, and $P_4$ to a switch $S_3$ via two resistors $R_{12}$ and $R_{13}$. The resistance value of each resistor $R_1$ to $R_{14}$ is the same.

In this circuit, the resistance value of the two resistors $R_4$ and $R_5$ connected to the ground is 2R. The resistance value of the two resistors $R_{12}$ and $R_{13}$ connected to the switch $S_3$ is also 2R. Since these two-resistor arms are parallel, the composite resistance value seen from point $P_4$ is R. Since these two-resistor arms are connected in series with the resistor $R_3$, the composite resistance value is 2R. Since this resistor circuit connected in series is connected in parallel with the two resistors $R_{10}$ and $R_{11}$, the composite resistance seen from the point $P_3$ is R. In the same way, in the circuit, seen from any point $P_1$, $P_2$, $P_3$, and $P_4$, two resistors are parallel, therefore, the composite resistance is R. The current flowing to each two resistors $R_6$ and $R_7$, $R_8$ and $R_9$, $R_{10}$ and $R_{11}$, and $R_{12}$ and $R_{13}$ is $8i$, $4i$, $2i$, and $i$ respectively. The switches $S_0$ to $S_4$ are switched to the left or the right in response to a digital input of 4 bits.

As shown in FIG. 1, when switched to the left side, connection is made to the inverting input $(-)$ of the operational amplifier OP. When switched to the right side, connection is made to the noninverting input $(+)$ side. The value of the current flowing to these inverting and non-inverting inputs from $R_{ref}$ is determined by the digital input in accordance with the state of the switch. The analog output $A_{out}$ converting this to a voltage value becomes a D/A conversion value of the above digital input.

Figure 2:
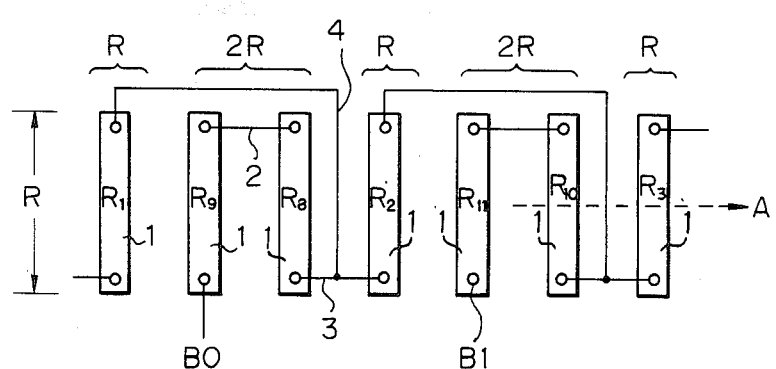
FIG. 2 is a plan view of the layout of a R-2R type resistance ladder network according to the prior art.

For the resistors of the R-2R type resistance ladder network RD, diffusion resistors or thin film resistors are normally used. FIG. 2 is one example of this lay-out of the prior art, wherein the 1's are the diffusion resistors of resistance value R. The diffusion resistors 1 are formed in a short strip form so that all are fairly parallel. Used individually, the resistance is R. Used with two connected in series, the resistance becomes a resistance value 2R. Reference numeral 2 is wiring for forming the 2R resistors (for example, aluminum), 3 is wiring for connecting R and 2R, and 4 is wiring for successively connecting between $R_1$ and the junction point of $R_2$ and $R_8$.

The defect of this layout is that there must be a portion of wiring 4 parallel to the diffusion resistors 1, in other words a portion running from one end to the other of the diffusion resistor. Therefore, it is not possible to form another wiring layer traversing the lengths of the diffusion resistor in the arrow direction A.

Figure 3:
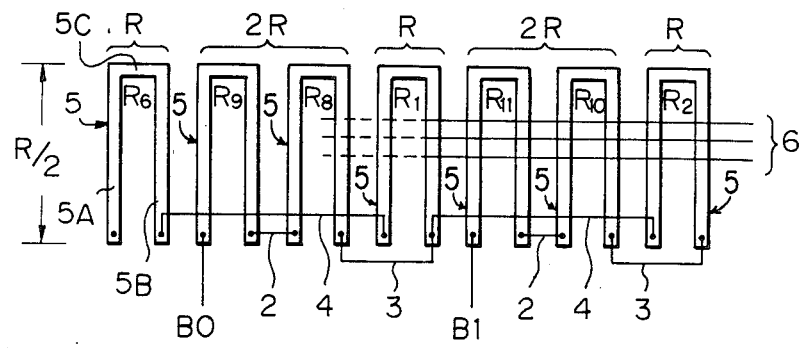
FIG. 3 is a plan view of an embodiment of the present invention.

FIG. 3 is a plan pattern diagram showing an embodiment of the present invention. This embodiment shows an R-2R type resistance ladder network. In the figure, 5 is a rectangular U-shaped diffusion resistor. This diffusion resistor 5 has a direct resistance value R comprising the total of one side 5A and the other side 5B and also the connection side 5C joining the ends of the two sides 5A and 5B. The connection side 5C may be an aluminum or other wiring layer of low resistance as shown in FIG. 4F. In such a case, the resistance values of the sides 5A and 5B are each R/2. By making the basic diffusion resistor R of the R-2R type resistance ladder a rectangular U-shape, it is possible to gather all mutual connection ends on the same side. Reference numerals 2 to 4 are wiring as in FIG. 2. Both wirings 2 and 4 are on one side of the rectangular U-shaped diffusion resistor. The mutual connection ends of each resistor 5 are connected at the same side without having to run the wiring parallel to the sides 5A and 5B. In this way, it is possible to form another wiring 6 horizontally traversing the sides 5A and 5B on the same level as the wiring 2 to 4, thereby enabling effective utilization of the chip area and improvement of the degree of integration.

Figures 4A, 4B, 4C:
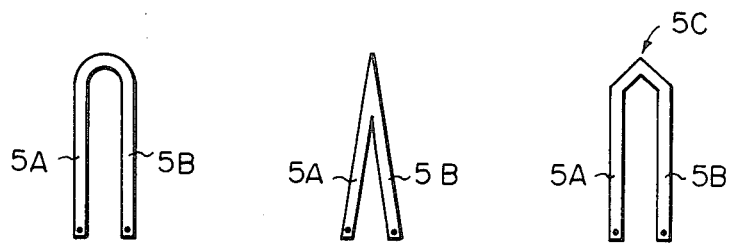
FIGS. 4A to 4F are plan views of various modifications of the resistor layer.
Figures 4D, 4E, 4F:
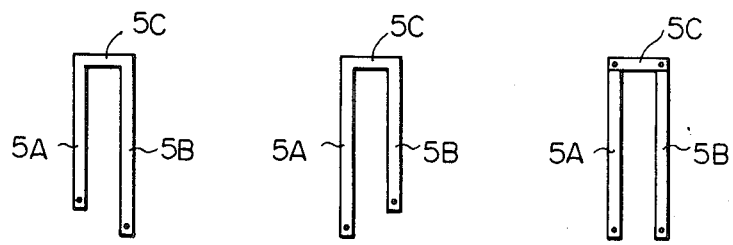

Further, while it was said that the connection side 5C could be a low resistance wiring layer, if sides 5A and 5B are each R/2, it is possible to make the two slanted and joined in a V-shape and therefore eliminate the side 5C, as shown in FIG. 4B.

In another embodiment, the diffusion resistor may be U-shaped as shown in FIG. 4A. The connection side 5C may be constructed by a V-shape diffusion layer as shown in FIG. 4C.

In the above embodiments, the lengths of the sides 5A and 5B of the diffusion resistor 5 are the same as each other. However, in another embodiment, the side 5A may be shorter than the side 5B, as shown in FIG. 4D, or longer than the side 5B, as shown in FIG. 4E.

Regarding the overall area of te ladder network RD, in the case, for example, where R is set to 25 kiloohm in the layout of FIG. 2, if the sheet resistance of the diffusion layer is made $\rho s = 1$ kiloohm/square 10 $\mu m \times 1$ kiloohm per 10 $\mu m$, the width W of the diffusion layer is 10 $\mu m$ and the length is 250 $\mu m$. Therefore, when forming an 8-bit D/A converter, since the number of diffusion layers reaches 25, the resistance stretch to about 400 $\mu m$ in the horizontal direction, assuming a distance between resistances of 6 $\mu m$, and a considerable area (250 $\mu m \times 400$ $\mu m$) is taken up by the ladder network. The area of the switch group SWG in this case is, with a complementary metal oxide semiconductor (CMOS), about 100 $\mu m \times 400$ $\mu m$. Consequently if it is possible to pass other wiring through the ladder network RD, having a large area of twice or more of the same, a considerable improvement in the degree of integration can be expected. In the case of FIG. 3 too, the same is true regarding area as with FIG. 2.

Figure 5:
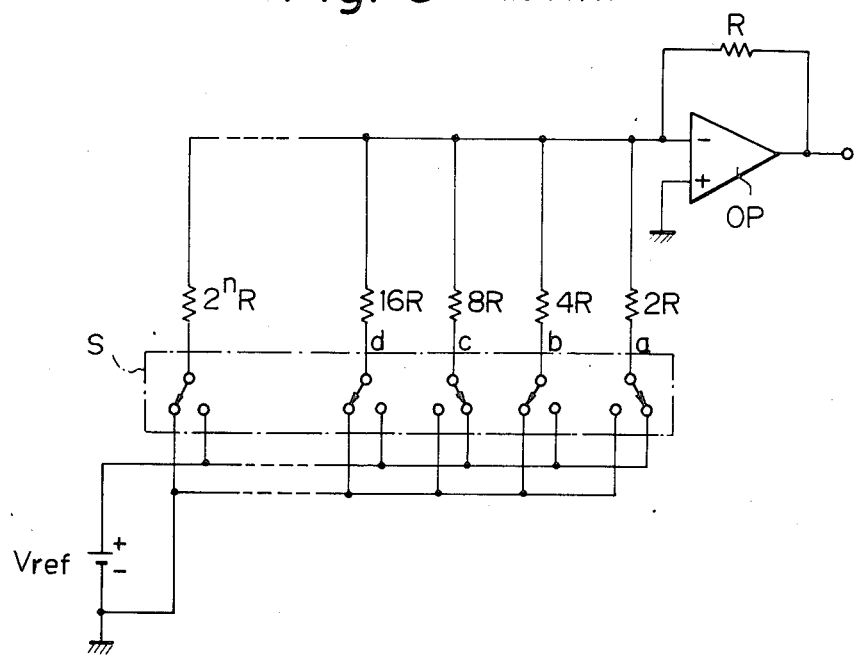
FIG. 5 is a circuit diagram of a $2^n$-R type D/A converter.

The present invention can also be applied to the $2^n R$ type D/A converter shown in FIG. 5. In FIG. 5, 2R, 4R, ... $2^n R$ are resistors, S is their switching circuit, $V_{ref}$ is the reference voltage, OP is an operational amplifier, and R is its feedback resistor.

Figure 6:
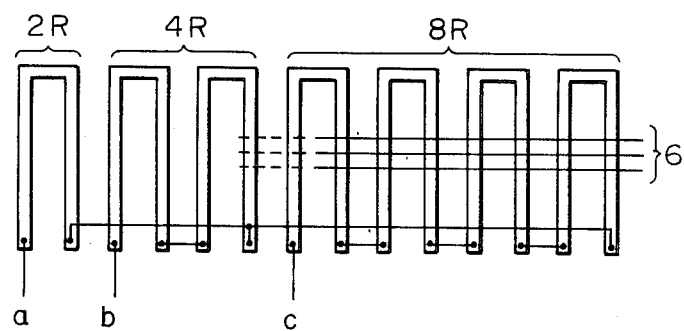
FIG. 6 is a plan view of another embodiment of the present invention.

FIG. 6 is a plan pattern diagram showing another embodiment of the present invention. In the figure, each rectangular U-shaped diffusion resistor has the same constitution as that in FIG. 3. The resistor 4R is composed by connecting in series two rectangular U-shaped diffusion resistors. The resistor 8R is composed by connecting in series four rectangular U-shaped diffusion resistors. The diffusion resistor shape may also be modified in this embodiment as shown in FIGS. 4A to 4F.

Many widely different embodiments of the present invention may be constructed without departing from the spirit and scope of the present invention. It should be understood that the present invention is not limited to the specific embodiments described in this specification, except as defined in the appended claims.

We claim:

1. A resistance ladder network used in an input portion of a D/A converter and formed in an LSI circuit, said resistance ladder network comprising:
    a plurality of resistors connected in a ladder format to form part of the ladder network, each of said resistors being generally parallel with one another, wherein each resistor is positioned laterally with respect to the length of the ladder network, and wherein each of said resistors has a U-shape or V-shape having a pair of legs electrically coupled at one end thereof, and each leg having a contact end opposite said one end such that each of said resistors have their contact ends on one lateral side of said ladder network, and their one ends on the opposite lateral side of said ladder network, and
    wherein conductive wirings interconnecting said resistors are formed on a different substrate level of said LSI circuit from said resistors, and run generally parallel to the length of said ladder network, such that space is provided on the same substrate level as said conductive wirings for other wirings to run along the length of the ladder network superimposed on said resistors.

2. A resistance ladder network as claimed in claim 1, wherein each resistor is composed of a resistance element of a continuous strip.

3. A resistance ladder network as claimed in claim 1, wherein each resistor is composed of two resistance elements of continuous straight strips and a conductive element connected therebetween.

4. A resistance ladder network as claimed in claim 2, wherein said continuous strip is a rectangular U-shape.

5. A resistance ladder network as claimed in claim 2, wherein said continuous strip is a V-shape.

6. A resistance ladder network as claimed in claim 2, wherein the lengths of said two legs of each resistor are equal to each other.

7. A resistance ladder network as claimed in claim 2, wherein the lengths of said two legs of each resistor are different from each other.

8. A resistance ladder network as claimed in claim 1, wherein said resistors are connected in an R-2R ladder format.

9. A resistance ladder network as claimed in claim 1, wherein said resistors are connected in a $2^n$-R ladder format.

* * * * *